United States Patent

[11] 3,610,959

[72] Inventor John A. Palmieri
Wappingers Falls, N.Y.
[21] Appl. No. 833,267
[22] Filed June 16, 1969
[45] Patented Oct. 5, 1971
[73] Assignee International Business Machines Corporation
Armonk, N.Y.

[54] DIRECT-COUPLED TRIGGER CIRCUIT
5 Claims, 4 Drawing Figs.

[52] U.S. Cl. .......... 307/247, 307/215, 307/289, 307/291, 307/300, 328/195
[51] Int. Cl. .......... H03k 17/00, H03k 19/34
[50] Field of Search .......... 307/289, 291, 215, 218, 300, 247; 328/195, 196

[56] References Cited
UNITED STATES PATENTS

| | | | |
|---|---|---|---|
| 26,082 | 9/1966 | Osborne | 307/291 |
| 3,307,047 | 2/1967 | Narud | 307/291 |
| 3,219,845 | 11/1965 | Nieh | 307/289 |
| 3,234,401 | 2/1966 | Dinman | 307/289 |
| 3,381,232 | 4/1968 | Hoernes | 307/289 |
| 3,505,535 | 4/1970 | Cavaliere | 307/300 |

*Primary Examiner*—Donald D. Forrer
*Assistant Examiner*—David M. Carter
*Attorneys*—Hanifin and Jancin and Kenneth R. Stevens

ABSTRACT: A symmetrical direct-coupled trigger circuit comprising first and second interconnected stages, each including current switch logic means. In the first stage, a plurality of current switches have selected respective collector output lines and emitter output lines interconnected to provide logic signals at a pair of nodes; the nodes are connected to the second stage so that accompanying signal propogation is held to two stages of delay.

INVENTOR
JOHN A. PALMIERI
BY Kenneth R. Stevens
ATTORNEY

DIRECT-COUPLED TRIGGER CIRCUIT

BACKGROUND OF THE INVENTION

1. Field of the Invention

This invention relates to a bistable circuit and more specifically to a direct-coupled trigger circuit.

2. Description of Prior Art

In monolithic integrated circuits, it is extremely desirable to minimize the number of circuit components needed to perform a particular logic function. Such a reduction in circuit components naturally reduces power dissipation and the attendant heating problems. A given integrated circuit module is capable of withstanding a maximum power dissipation for a given surface area or device density. Reducing the total number of components for a given logical function allows a greater number or higher density of components to be placed on a given module. Increasing the circuit or component density of an integrated circuit module greatly reduces the cost per individual module

SUMMARY OF THE INVENTION

It is an object of this invention to reduce the number of components in a current switch direct-coupled trigger circuit.

It is another object of this invention to provide an improved direct-coupled trigger circuit having reduced power dissipation.

Another object of the present invention is to provide an improved current switch direct-coupled trigger circuit which is adaptable for monolithic integrated circuit techniques at a substantial cost reduction.

Finally, it is another object of the present invention to provide an improved direct-coupled trigger circuit having only two stages of signal propagation delay time.

The present invention comprises a direct-coupled trigger circuit having first and second interconnected stages. The first stage includes a first and second section with each section including first and second associated current switches. Each of the current switches comprises a switching transistor, each transistor having a base input terminal, an emitter terminal connected to an emitter output line, and a collector terminal connected to a collector output line, and a constant current supply means connected to each of the emitter output lines. The emitter output line of each of the first current switches is connected to the collector output line of its associated second current switch so as to create a pair of output nodes is connected to a transistorized antisaturation circuit and then to a symmetrically coupled second output stage.

DESCRIPTION OF THE DRAWINGS

The foregoing and other objects, features and advantages of the invention will be apparent from the following more particular description of the preferred embodiment of the invention as illustrated in the accompanying drawings in which.

DETAILED DESCRIPTION OF THE INVENTION

Figure 1:
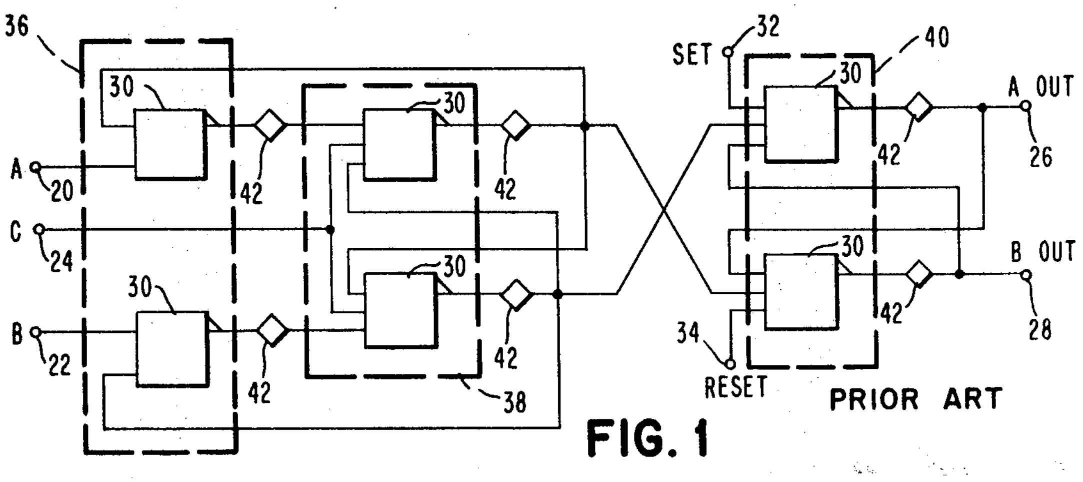
FIG. 1 is a schematic block diagram of a prior art direct-coupled trigger circuit.

Now turning to FIG. 1, shown is a prior art direct-coupled trigger circuit. A brief description of the prior art trigger circuit is presented in order to more distinctly point out the present invention shown in FIGS. 2, 3, and 4.

The circuit of FIG. 1 is adapted to receive a pair of logic input levels A, B (not shown) at input terminal 20 and 22, respectively, and input control signal C (not shown) at terminal 24. Output terminals 26 and 28 are adapted to receive the $A_{out}$ and $B_{out}$ output logic level signals. The circuit itself is constructed of suitably interconnected NOR current switch blocks, generally indicated as 30. Conventionally, a Set input signal is applied to set line 32 and a Reset signal to reset line 34. The reset condition of the direct-coupled trigger is defined as the $A_{out}$ line 26 being in an "up" or positive condition and the $B_{out}$ 28 being in a "down" or negative state. Conversely, the trigger is deemed in a Set state when the $A_{out}$ line 26 is in a negative or down condition and the $B_{out}$ line 28 is at a positive or up level. The prior art circuit of FIG. 1 actually includes an input stage 36, an intermediate stage 38, and an output stage 40. Emitter follower output circuits indicated schematically as 42 interconnect the output terminals of stage 36 to the next succeeding stage 38 and to the ultimate output terminals 26 and 28 from stage 40.

It is quite clear from FIG. 1 that the prior art circuit requires three stages of delay and six emitter output follower circuits to provide a trigger output function to the output terminals 26 and 28.

Figure 2:
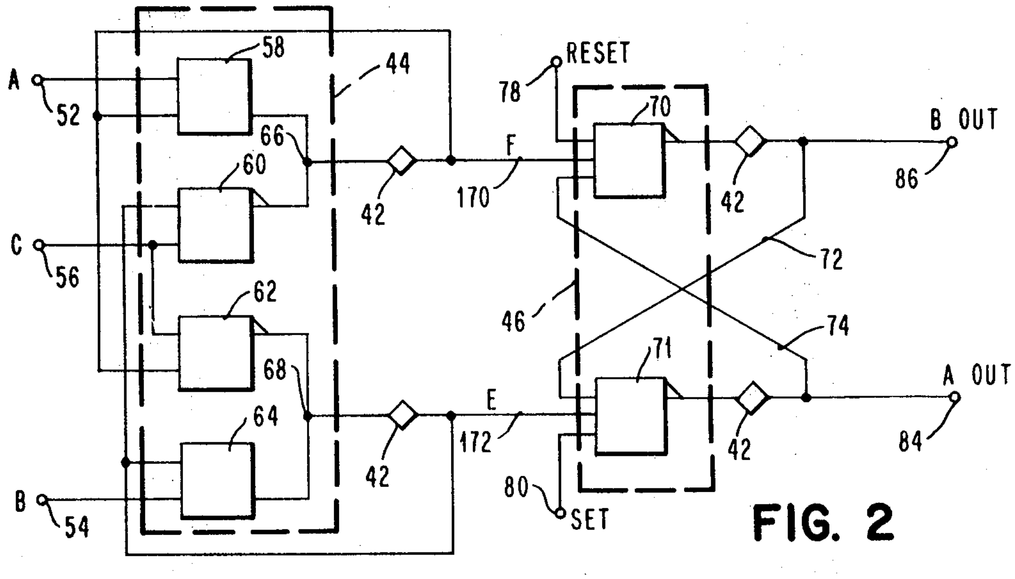
FIG. 2 is a schematic block diagram of a direct-coupled trigger circuit which is a preferred embodiment of the present invention.

Now referring to the preferred embodiment of the present invention, as illustrated in FIG. 2, it is distinctly seen that the circuit of the present invention employs only two stages of delay, 44 and 46. Equally important, the circuit only requires four emitter follower output circuits 42. In FIG. 2 and the succeeding figures, like reference numerals will be employed to indicate like elements as discussed above with respect to the prior art circuit of FIG. 1.

Now referring to FIGS. 2 and 3 and the accompanying specific description of the detailed structure, the improved direct-coupled (DC) trigger circuits of the present invention employ the NOR current switch circuits previously described with reference to FIG. 1 and also, OR current switch logic sections. A pair of logic input terminals 52 and 54 receive logic input signals A, B, respectively. An input control signal C is received at input control terminal 56. The input terminals connect to the first input stage 44. The input stage 44 includes a first section comprising first and second current switch blocks 58 and 60, and a second section comprising current switch blocks 62 and 64. The NOR blocks 62 and 60 are represented with a triangle at its output line, while the OR blocks 58 and 64 do not have that schematic designation. Current switches 58 and 60 are interconnected at a first common node 66 and current switches 62 and 64 are similarly interconnected at a common node 68. The second stage 46 includes a pair of cross-coupled NOR blocks 70 and 71 symmetrically interconnected by lines 72 and 74, respectively. A Reset signal is applied to block 70 via line 78. A Set signal is applied to block 71 via line 80. The logic output signals $A_{out}$ and $B_{out}$ are taken from output terminals 84 and 86, respectively. The emitter follower circuits designated generally as 42, interconnect the first section 44 to the second section 46, and also connect the respective output lines from the second stage 46 to their respective output terminals 84 and 86.

Figure 3:
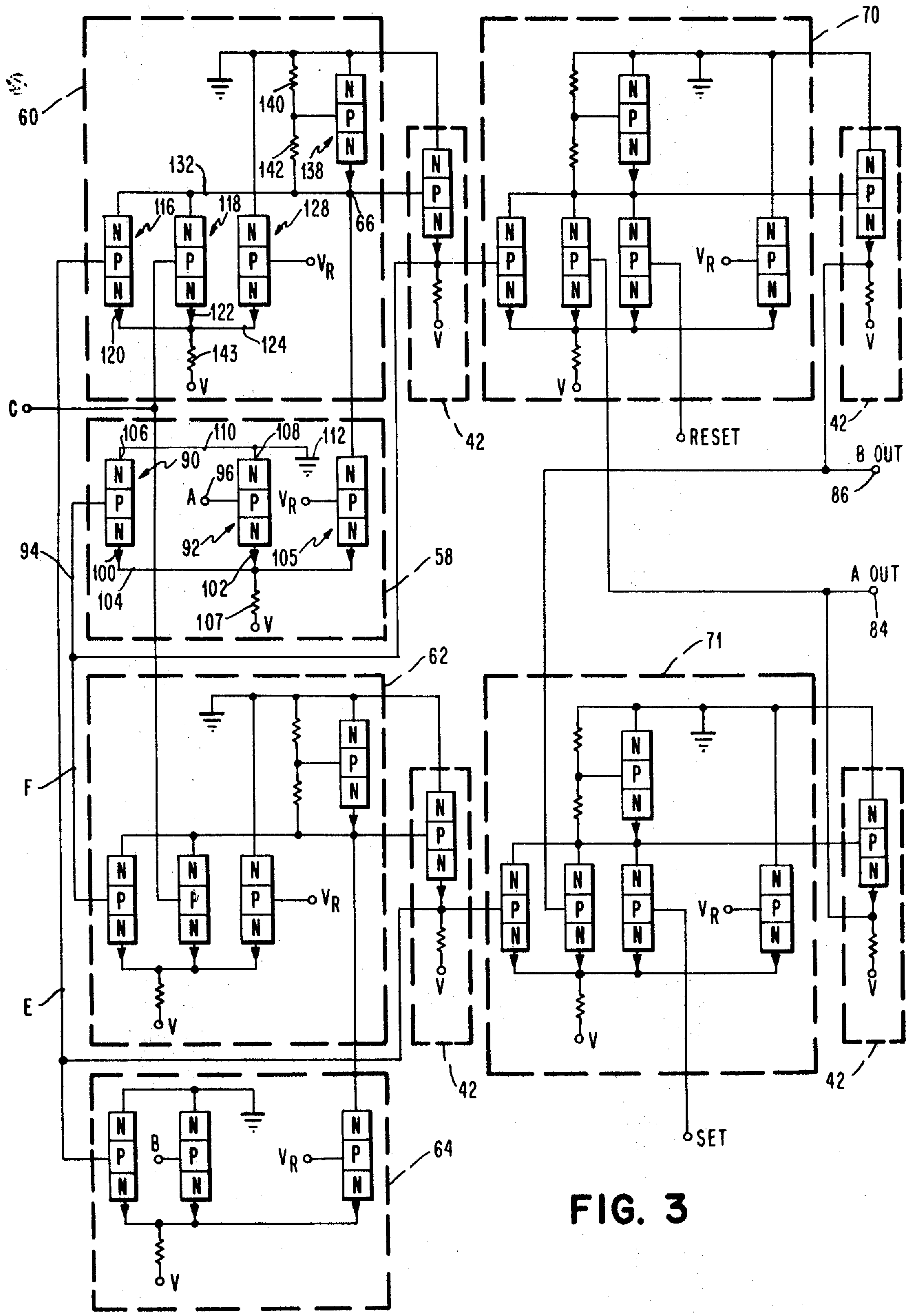
FIG. 3 is a detailed schematic diagram illustrating the actual components of the preferred embodiment shown in FIG. 2.

FIG. 3 discloses the specific details of the circuit shown generally in FIG. 2. As the various logic blocks of FIG. 3 are either identical or substantially identical to each other with respect to either the NOR or OR block, it is thus only necessary to specifically describe a single NOR block and a single OR block. The other circuits only differ by the number of input switching transistors which each circuit contains. Taking OR block 58 as illustrative, it can be seen that the block comprises a basic current switch including a pair of switching transistors 90 and 92 which are adapted to receive logic signals at their respective base terminal 94 and 96, respectively. The transistors further include respective emitter terminals 100 and 102 connected to a common emitter output line 104. The emitter line 104 connects to reference or translating transistor 105. The collectors 106 and 108 are connected to an output collector line 110, which line 110 is connected to ground 112 in the OR configuration.

Similarly, the NOR version shown in block 60 also comprises a plurality of input switching transistors 116 and 118 having their respective emitters 120 and 122 connected to a common emitter line output 124, which line 124 connects to a translation transistor 128 having its base terminal connected to a reference voltage $V_R$ and its collector terminal connected to ground. The collectors of transistors 116 and 118 are connected to a common collector line 132. The collector line 132 of NOR block 60 and the collector of transistor 105 of OR block 58 interconnect at common node 66.

Also connected to node 66 is a first antisaturation transistorized clamping impedance network comprising transistor 138 and a pair of biasing resistors 140 and 142. The antisaturation network maintains the transistors 116 and 118 out of saturation. If an input signal at one or more of the base inputs at the transistors 116 or 118 goes to an "up" state, or the base inputs to transistors 90 and 92 goes to a "down" state, current begins to flow through the resistors 140 and 142 and an attendant drop in potential at node 66 occurs. However, the potential at node 66 is prevented from falling substantially below the upper potential level of that established at the bases of the input switching transistors since eventually the voltage drop across resistor 142 forward biases the base-emitter junction of transistor 138. Transistor 138 is sufficiently biased to cause it to operate in the active region so that its emitter presents an extremely low impedance to the node 66. Thus the potential at node 66 is prevented from dropping below a definite predetermined level.

Of course, the respective current switches 58 and 60 operate in a conventional manner to switch current from two sources constituted by resistors 107, 143 and a pair of interconnected voltage sources V, either through the translating transistor 128 or through switching transistors 116 and 118, as is well known in the art. The output node 66 connects to the second stage comprising cross-coupled blocks 70 and 71 via a pair of emitter follower output circuits generally shown at 42 which operate in a manner well known in the art. Similarly, the remaining logic blocks of the first stage 44 and the second stage 46 operate identically to that previously described, except as to the number of input transistors which is varied to accommodate a different number of logic input signals.

Figure 4:
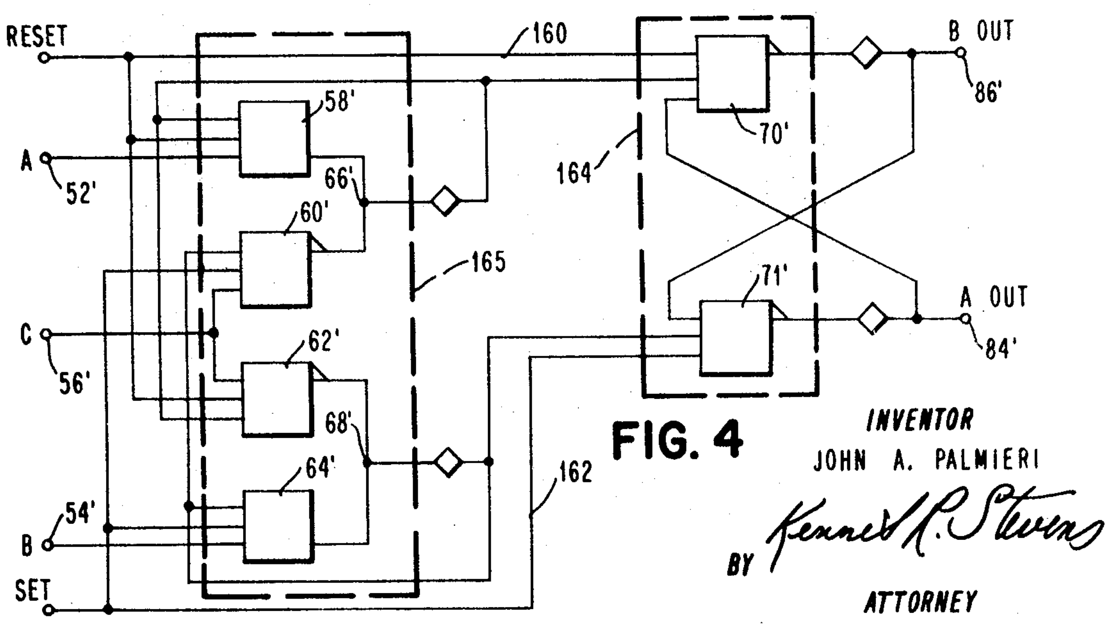
FIG. 4 is a schematic block diagram of a second embodiment of the present invention.

The FIG. 4 circuit is comprised of building elements identical or substantially identical to that shown in FIG. 2 and operates in an identical manner except for the reset and set interconnections. In FIG. 4, a Reset line 160 and a Set line 162 connect to the second stage 164, as in the preferred embodiment of FIGS. 2 and 3 and also connect to the input stage 165. In particular, Reset line 160 connects to current switch blocks 58' and 62' and set line 162 connects to current switch blocks 60' and 64'. Prime numbers are used in FIG. 4 to indicate like elements to that shown in the embodiment of FIG. 2.

OPERATION

In the preferred embodiment of FIG. 2, the trigger circuit produces output signal on lines 84 or 86 only when a negative transition occurs as a result of an input control pulse C being applied to terminal 56. The $A_{out}$ output signal on line 84 will assume the state of the input line 52, that is the A input signal, and the output line 86 will assume a $B_{out}$ output signal level which corresponds to the state of the B signal being applied to input terminal 54. The output terminals will assume these corresponding states in accordance to the state that existed on each of the respective input lines immediately prior to the negative transition of signal C on line 56. In this embodiment it is necessary that the A and B input signal levels are orthogonal to each other. That is, one logical input level is in the opposite state relative to the other logical input level. The orthogonality requirement of the preferred embodiment of FIG. 2 does not seriously limit its application since this trigger, when used in a shift register or timing ring, encounters a condition in which the A and B signals are always inverse to each other. When the trigger circuit is used in a counter, the output line 86 is connected to the input line 52 of the next trigger circuit and the output line 84 is connected to the input line 54 of the next trigger circuit to insure that the orthogonal relationship exists between the A and B input signals being applied to their respective terminals. In this mode of operation, the output signals on lines 84 and 86 change state for each negative transition at input terminal 56.

More specifically, the Reset and Set lines 78 and 80 are normally held in a negative or down state. When the input terminal 56 is in an up state or at a logical one level, a logical one Set pulse will cause the $A_{out}$ output signal at terminal 84 to be in a down state, and the $B_{out}$ output signal on terminal 86 to be in an up state. A logical one Reset pulse will switch the $B_{out}$ output signal to a down state and the $A_{out}$ output signal to a logical one or up state. When the C input control signal is in an up state the circuit is in an inhibit mode of operation. During this mode of operation, changes on the input lines 52 and 54 will not affect the state of the output signals $A_{out}$ or $B_{out}$ on lines 84 and 86. The logical expression for the input signal being applied from the stage 44 to the second stage section 70 is given by $F=(A+F)(\overline{C+E})$. The F signal is applied to the second stage section 70 via line 170. A logical signal is applied to the second stage section 71 via line 172 from the first stage and is represented by the expression $E=(B+E)(\overline{C+F})$.

The Boolean output expressions as a function of R, S, F, E, $A_o$ and $B_o$ where R=Reset S=Set $A_o=A_{out}$ $B_o=A_{out}$ is $A_o=\overline{S+E+B_o}$ and $B_o=\overline{R+F++A_o}$ Moreover, a State Table is given for the various E and F signal levels, which vary in accordance with the states of the A, B, C, Set and Reset signal states, in order to more fully describe the circuit operation.

LOGICAL STATE TABLE

| | Previous EF State | | | |
|---|---|---|---|---|
| | 00 | 01 | 10 | 11 |
| A B C | Resulting EF State | | | |
| 0 0 0 | 00 | 01 | 10 | 00 |
| 0 0 1 | 00 | 00 | 00 | 00 |
| 0 1 0 | 10 | 01 | 10 | 00 |
| 0 1 1 | 00 | 00 | 00 | 00 |
| 1 1 0 | 11 | 01 | 10 | 00 |
| 1 1 1 | 00 | 00 | 00 | 00 |
| 1 0 0 | 01 | 01 | 10 | 00 |
| 1 0 1 | 00 | 00 | 00 | 00 |

Now referring to the trigger circuit of FIG. 4, which is a slight modification of the preferred embodiment of FIG. 2, this circuit is logically interconnected by way of its Reset and Set lines in such a manner that it is insured that the input signal to circuit 60' or 62' is positive or in an up state during the time period in which the C input signal on line 56' is switched to the down state. This eliminates the potential race condition shown in the state table when the orthogonality restriction on inputs A and B is ignored. In the circuit the Reset condition of the trigger is defined as one in which the $A_{out}$ line is positive and the $B_{out}$ output signal on line 86' is negative. Conversely, the trigger is said to be Set when the $A_{out}$ on line 84' is negative and the $B_{out}$ signal on line 86' is positive or up. Since the logical connections of this trigger are symmetrical, only the Reset function is described. The Set function performs the same logic with the only difference being that the output signals on lines 84' and 86' are in opposite states. For proper operation of the circuit it is required that the Reset signals and Set signals on lines 160 and 162 never occur simultaneously.

The Reset signal is normally maintained in a negative state and is applied to both the first and second stages 164 and 165. The Reset signal is applied to cells 58', 62' and 70'. In this negative condition, the Reset signal does not have any influence on the circuit and the trigger output condition is determined solely by the state of the input lines 52, 56', 54' and 162. This mode of Reset interconnection to first and second stages guarantees that the input signal to circuits 58' and 62' which is applied to line 160 is always positive during the Reset. In other words, this type of interconnection insures that a positive Reset signal will unconditionally control the output state of the trigger on lines 84' and 86'.

Thus, in all combinations of input states, conditions of the A, B, and C signals, the compound Reset signal will be the controlling factor, and the A, B, and C signals will not control the trigger action until the Reset signal is removed and the normal control of the trigger is resumed in response to the state of the signals on lines 52, 54' and 56'.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A DC trigger circuit comprising:

a. first and second interconnected stages, a pair of logic input terminals and input control terminal means connected to said first stage, and a pair of trigger input terminals and a pair of trigger output terminals connected to said second stage;

b. said first and second stages including current switches;

c. each of said current switches having a plurality of switching transistors, each transistor having a base input terminal, an emitter terminal connected to an emitter output line, and a collector terminal connected to a collector output line, and a constant current supply means connected to each of said emitter output lines;

d. said first stage including a first and a second section;

e. said first and second sections each including a first and an associated second of said current switches;

f. said emitter output line of said first current switch of said first section being connected to said collector output line of its associated second current switch to create a first output node at said first section, said emitter output line of said first current switch of said second section being connected to said collector output line of its said associated second current switch to create a second output node at said second section, said pair of trigger input logic terminals of said second stage being connected to said first and second output nodes;

g. a set and a reset line connected to said second stage; and h. said pair of logic input terminals being responsive to applied input signals at one time period to store input data in said first stage and said input control terminal being responsive to an applied control signal at a second time period to transfer data stored in said first stage to said second stage, and said set and reset lines being responsive to applied set and reset signals, independent of the input and control signals, to transfer data to said second stage trigger output terminals.

2. A DC trigger circuit as in claim 1 including:

a. first and second emitter follower circuits;

b. said first emitter follower circuit being connected between said first output node and one of said trigger input logic terminals, and said second emitter follower circuit being connected between said second output node and the other of said trigger input logic terminals.

3. A DC trigger circuit as in claim 2 wherein:

a. said second stage includes a third and a fourth cross-coupled section, each section associated with a respective one of said pair of trigger output terminals; and b. said third and fourth sections including, respectively, a third and fourth of said current switches.

4. A DC trigger circuit as in claim 3 including:

a. third and fourth emitter follower circuits;

b. said third emitter follower circuit being connected between one of said pair of trigger output terminals and said third section; and c. said fourth emitter follower circuit being connected between the other of said pair of trigger output terminals and said fourth section.

5. A DC trigger circuit as in claim 4 including:

a. a first antisaturation transistorized clamping impedance network connected to said first output node; and b. a second antisaturation transistorized clamping impedance network connected to said second output node.